United States Patent [19]

Massit et al.

[11] Patent Number: 4,761,517

[45] Date of Patent: Aug. 2, 1988

[54] ELECTRICAL CONNECTIONS WITH CONTROLLED THERMAL AND ELECTRICAL RESISTANCES

[75] Inventors: Claude Massit, Grenoble; Gérard Nicolas, Voreppe, both of France

[73] Assignee: Commissariat a l'Energie Atomique, Paris, France

[21] Appl. No.: 44,784

[22] Filed: May 1, 1987

[30] Foreign Application Priority Data

May 5, 1986 [FR] France .................... 86 06478

[51] Int. Cl.⁴ .................................... H01B 7/08
[52] U.S. Cl. ...................... 174/36; 174/117 FF; 174/117 PC; 174/126.2
[58] Field of Search ............ 174/36, 117 FF, 117 PC, 174/126 C, 126 CP

[56] References Cited

U.S. PATENT DOCUMENTS 3,356,276  12/1967  Robinson, Jr. et al. ...... 174/126 CP
3,666,879   5/1972  Hirsch et al. ............. 174/126 CP X
3,828,111   8/1974  Berthet .................... 174/150

FOREIGN PATENT DOCUMENTS 2353013  12/1977  France .
 980468   1/1965  United Kingdom .
2070320   9/1981  United Kingdom ............. 174/36

Primary Examiner—Morris H. Nimmo
Attorney, Agent, or Firm—James E. Nilles

[57] ABSTRACT

Flat electrical connecting cable with controlled electrical and thermal resistances.

It comprises a flat insulating support, on which are installed connecting lines constituted by two superimposed layers. The first of them is constituted by a poor heat conducting material, such a manganin, while the second is discontinuous andis formed from a very good electric conducting material, such as copper. The segments on which the second layer is installed are thermally insulated an at uniform temperature. It is possible to vary the conductivity of the different layers by acting on the thickness and width thereof.

This invention is applicable in industries such as cryogenics and space, as well as all applications functioning between a cold source and hot source, where it is wished to control the heat exchanges.

10 Claims, 2 Drawing Sheets

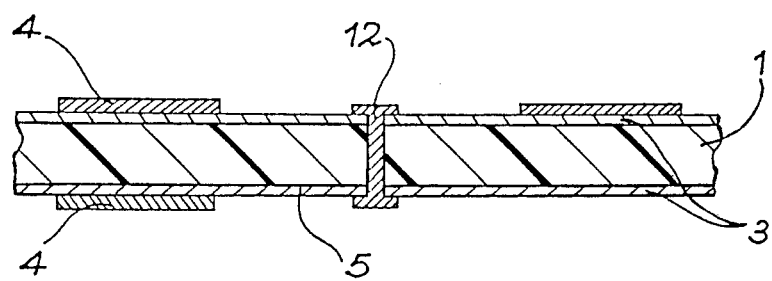
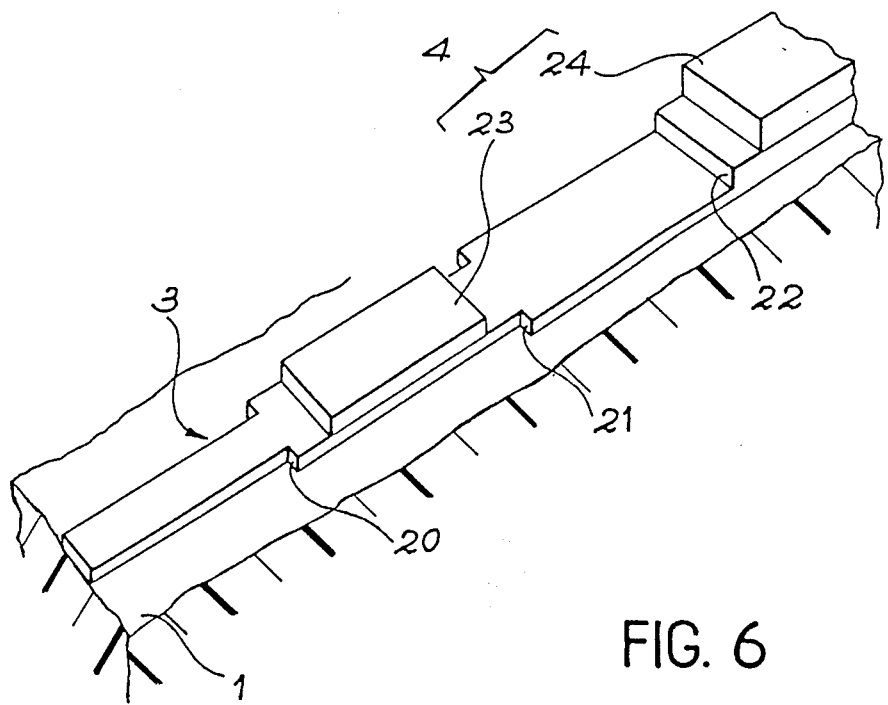
FIG. 5
FIG. 6

ELECTRICAL CONNECTIONS WITH CONTROLLED THERMAL AND ELECTRICAL RESISTANCES

BACKGROUND OF THE INVENTION

The present invention relates to electric lines for connecting points between which heat transfers have to be controlled and limited, particularly between a hot source and a cold source. There are two obvious, but non-limitative fields of application, namely cryogenics and space.

At present, stainless steel cables are widely used for this purpose, but suffer from the disadvantage of being voluminous and having a high weight, as well as a relatively high electrical resistance. Finally, they do not make it possible to modify in the desired manner the temperature along the cable.

Consideration has also been given to a different design consisting of depositing copper layers on an insulating and generally flexible support, which can also be locally or completely rigid. These layers are interrupted at the points where it is wished to have a good thermal insulation and they are connected by manganin wires welded to the tracks and fixed by a random process to the insulating support. Copper has the advantage of a low electrical resistance, whereas manganin connections, manganin being a material with a high thermal resistance, constitute barriers to heat exchangers along the connections. However, the laying of manganin wires cannot be laid in a sufficiently reliable manner to provide a completely satisfactory solution.

Thus, the present invention provides an improvement in the design of these flat cables by simpler and more reliable manufacture, as well as providing the possibility of modifying the electrical and thermal resistance characteristics along lines of such cables.

SUMMARY OF THE INVENTION

More specifically the invention relates to a flat, thermally and electrically insulating support, which can be flexible, rigid or zonally rigid as a function of the particular case. It is advantageously possible to use e.g. epoxy glass or polyimide products.

On said support are installed connecting lines constituted by two superimposed layers. The first of them extends over the entire length of the line and is made from a material with a low thermal conductivity, whilst still permitting the passage of electricity. The second layer is discontinuous and made from a very good electrically and thermally conducting material. According to a preferred embodiment of the invention, the material constituting the first layer is manganin, whilst that of the second layer is a metal such as copper, or even nickel or gold.

An important feature of the invention is that the thickness and width of the layers of conductors along the connecting lines, as well as the length of the zones on which the discontinuous conductive layer is installed are variable, so as to be able to regulate heat and electrical dissipation along the connecting lines.

BRIEF DESCRIPTION OF THE DRAWINGS

The invention is described in greater detail hereinafter relative to non-limitative embodiments and the attached drawings, wherein show:

FIGS. 5 and 6, two supplementary embodiments of cables according to the invention.

DETAILED DESCRIPTION OF THE PREFERRED EMBODIMENTS

Figure 1:
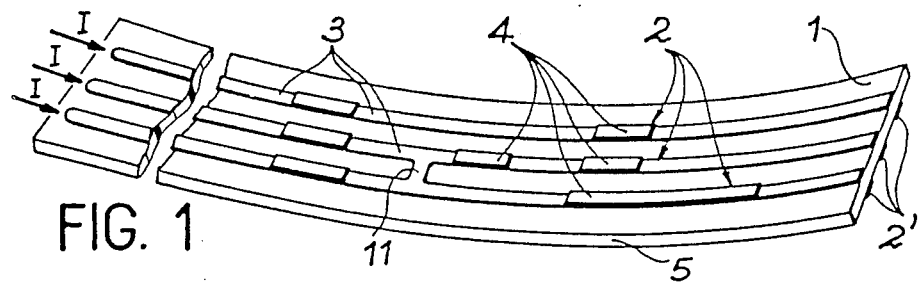
FIG. 1, in perspective a cable provided with several parallel line according to the invention.

The cable of FIG. 1 comprises an insulating support 1 and several connecting lines 2. Each of these lines is constituted by a continuous manganin layer 3 and a discontinuous layer formed from electrically conducting metal segments 4, as will be more apparent from FIG. 2b, which also shows how the metal deposits 4.1 to 4.4 make is possible to graduate the temperature along the line.

Thus, the current and heat in preferred manner traverse metal 4 wherever it exists, which leads (FIG. 2a) to zones with a low electrical resistance and uniform temperature. However, the current and heat must utilize the manganin layer 3 for the propagation thereof at the points where the second layer is interrupted. Thus, these points correspond to heat barriers due to the poor thermal conductivity of the manganin, whilst the electrical resistance is somewhat higher.

Figure 4:
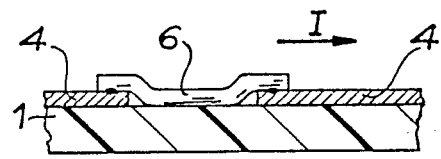
FIG. 4, a side view of a thermally insulated flat cable line according to the prior art.

Thus, in a somewhat more satisfactory manner the result obtained by the known principle shown in FIG. 4 is brought about, in which the copper layers 4 are connected by manganin wires 6 welded by their ends to the copper 4 and fixed by a random process, such as adhesive paper, to an insulating support 1.

Figure 2:
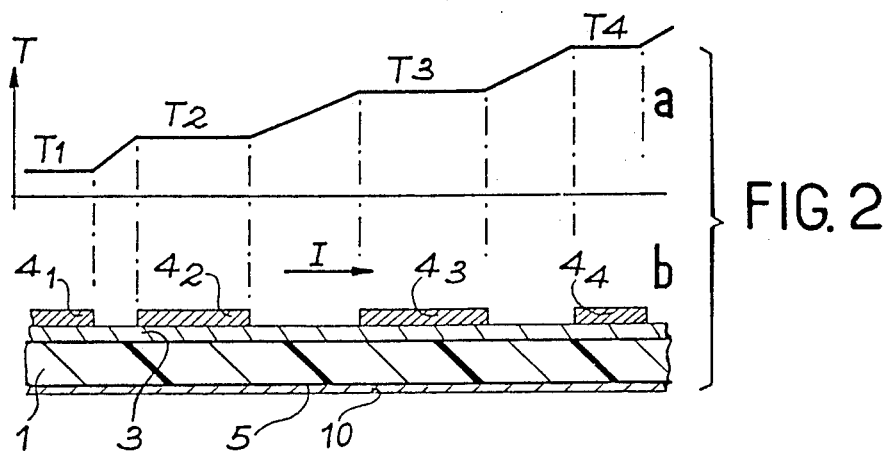
FIG. 2, a side view of a line according to the invention (2b), as well as a graph of the possible temperatures along said line (2a).
Figure 3:
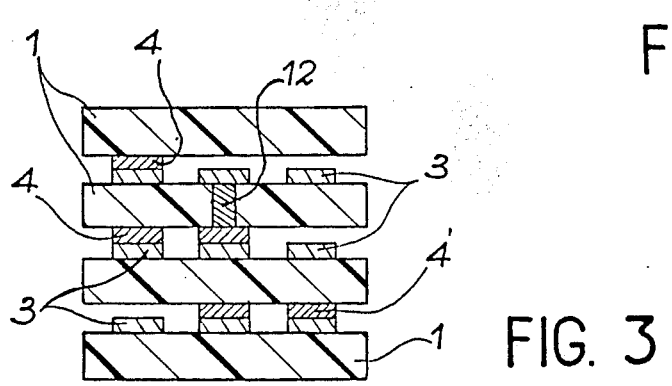
FIG. 3, a cross-section of a multilayer cable obtained by superimposing several cables of the type shown in FIGS. 1/2.

On the basis of the lines constructed according to the principle of FIGS. 1 and 2, it is possible to envisage various practical realizations of the cables. The flat support 1 makes it possible to install in parallel several lines 2, as shown in FIG. 1. It is possible to use the second face 5 of the insulating support 1. According to a first embodiment of the invention, the second face 5 of the insulant supports other connecting lines 2'. According to a second embodiment of the invention, said face 5 supports a mass plane 10 ensuring the shielding of the cable. The cable can also be shielded by certain of the connecting lines thereon. Lines 2 can be electrically interconnected either by means of conductive connections 11 (FIG. 1) located on one face between two or more adjacent lines, or by perforating insulating support 1 and fitting a conductive pin or cross-member 12 (FIGS. 3 and 5) between two lines located on opposite faces of said support. It is also possible to produce multilayer cables by superimposing several thicknesses of insulating supports 1 provided with their conductors 3 and 4, as shown in FIG. 3.

In general terms, lines 2 and 2' can have brakes or jumps in the width and thickness of the layers of two conductors 3 and 4. FIG. 6 shows a manganin layer 3 having two width jumps 20, 21 and one thickness jump 22, as well as a copper layer 4 formed from two parts 23, 24 also having different widths and thicknesses.

This novel design of low thermal conductivity cables consequently offers a certain number of advantages compared with the known solution and shown in FIG.

4, according to which the conductive metal segments 4 are interconnected by manganin wires 6 welded to the ends thereof and bonded by a random process to the insulant 1. The technology proposed by the invention is simpler and more reliable, whilst still permitting more finally regulated thermal and electrical dissipations. These favourable characteristics should facilitate the penetration by the invention of industries such as space, particularly as the weight and cost of such flat cables are lower than the equivalent stainless steel circuits formed from round cables and in addition a greater density of lines can be installed.

What is claimed is:

1. An electrical connecting cable formed from a flat insulating support, on at least one face of which is installed at least one connecting line wherein said at least one connecting line is constituted by two superimposed layers, the first of them, which extends over the entire length of said at least one line, being made from a material having a low thermal conductivity, while still permitting the passage of electricity and the second layer is made of segments spaced at intervals and made from a material which is both a good electrical and thermal conductor.

2. A cable according to claim 1, wherein several said lines are installed in parallel on the insulating support.

3. A cable according to claim 2, wherein the thickness and width of the conductive layers along the connecting lines are variable, so as to be able to regulate the thermal and electrical dissipations along the connecting lines.

4. A cable according to claim 2, wherein the second face of the insulating support supports other connecting lines used for shielding the cable.

5. A cable according to claim 4, wherein a plurality of conductive pins traverse the insulating supports and are electrically interconnected to selected said lines located on the two opposite faces of said supports.

6. A cable according to claim 2, wherein the second face of the insulating support supports a mass plane used for shielding the cable.

7. A cable according to claim 6, wherein a plurality of conductive pins traverse the insulating supports and are electrically interconnected to selected said lines located on the two opposite faces of said supports.

8. A multilayer electrical connecting cable formed from at least two superimposed flat insulating supports with a plurality of connecting lines positioned in the interface between the superimposed flat supports, selected said connecting lines comprise first and second superimposed layers, said first layer, which extends over the entire length of the connecting lines, being made from a material having a low thermal conductivity while still permitting passage of electricity and said second layer being made of segments spaced at intervals and made from a material which is both a good electrical and thermal conductor.

9. A cable according to claim 8 wherein several lines are installed in parallel on the insulating support.

10. A cable according to claim 9, wherein a plurality of conductive pins traverse the insulating support and are electrically interconnected to selected said lines located on the two opposite faces of said supports.

* * * * *